United States Patent
Sorenson et al.

(10) Patent No.: US 10,718,198 B2
(45) Date of Patent: Jul. 21, 2020

(54) OPPORTUNISTIC SENSOR FUSION ALGORITHM FOR AUTONOMOUS GUIDANCE WHILE DRILLING

(71) Applicant: HRL Laboratories, LLC, Malibu, CA (US)

(72) Inventors: Logan D. Sorenson, Thousand Oaks, CA (US); Shuoqin Wang, Oak Park, CA (US); David L. Walter, Los Angeles, CA (US); Adour V. Kabakian, Monterey Park, CA (US); Keerti S. Kona, Woodland Hills, CA (US); Hung Nguyen, Los Angeles, CA (US); Raviv Perahia, Agoura Hills, CA (US); David Chang, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 264 days.

(21) Appl. No.: 15/823,489

(22) Filed: Nov. 27, 2017

(65) Prior Publication Data

US 2018/0080310 A1   Mar. 22, 2018

Related U.S. Application Data

(63) Continuation-in-part of application No. 15/387,435, filed on Dec. 21, 2016, now Pat. No. 10,514,261, and
(Continued)

(51) Int. Cl.
E21B 44/00 (2006.01)
E21B 47/04 (2012.01)
(Continued)

(52) U.S. Cl.
CPC .......... *E21B 44/005* (2013.01); *E21B 47/022* (2013.01); *E21B 47/04* (2013.01);
(Continued)

(58) Field of Classification Search
CPC .... E21B 47/04; E21B 47/022; E21B 41/0092; E21B 44/005; G01C 19/00; G01C 21/16; G01P 15/105; G01P 15/18; G01R 33/0286
See application file for complete search history.

(56) References Cited

U.S. PATENT DOCUMENTS

| 4,205,379 A | 5/1980 | Fox et al. |
| 4,454,756 A | 6/1984 | Sharp et al. |

(Continued)

FOREIGN PATENT DOCUMENTS

| EP | 1 860 403 B1 | 8/2011 |
| WO | WO2012173601 A1 | 12/2012 |

(Continued)

OTHER PUBLICATIONS

Introduction to Wellbore Positioning by Angus Jamieson/UHI Scotland, (2012), pp. 39-41.
(Continued)

*Primary Examiner* — Elias Desta
(74) *Attorney, Agent, or Firm* — Tope-McKay & Associates

(57) ABSTRACT

Described is a system for estimating a trajectory of a borehole. The system processes signals of sensor streams obtained from an inertial sensor system. Using the set of processed signals, the system determines whether a drill is in a survey mode state or a continuous mode state, and a measured depth of the borehole is determined. A set of survey mode positioning algorithms is applied when the drill is stationary. A set of continuous mode navigation algo-
(Continued)

rithms is applied when the drill is non-stationary. Using at least one Kalman filter, results of the set of survey mode positioning algorithms and the set of continuous mode navigation algorithms are combined. An estimate of a borehole trajectory and corresponding ellipse of uncertainty (EOU) is generated using the combined results.

22 Claims, 8 Drawing Sheets

Related U.S. Application Data a continuation-in-part of application No. 15/279,390, filed on Sep. 28, 2016, now Pat. No. 10,246,988.

(60) Provisional application No. 62/451,019, filed on Jan. 26, 2017, provisional application No. 62/427,561, filed on Nov. 29, 2016, provisional application No. 62/321,042, filed on Apr. 11, 2016, provisional application No. 62/233,936, filed on Sep. 28, 2015.

(51) Int. Cl.
  *E21B 47/022*  (2012.01)
  *G01C 21/16*  (2006.01)
  *E21B 41/00*  (2006.01)
  *G01R 33/02*  (2006.01)

(52) U.S. Cl.
  CPC .......... *G01C 21/16* (2013.01); *E21B 41/0092* (2013.01); *G01R 33/0206* (2013.01)

(56) References Cited

U.S. PATENT DOCUMENTS

| | | | |
|---|---|---|---|
| 4,542,647 A | 9/1985 | Molnar | |
| 4,812,977 A | 3/1989 | Hulsing | |
| 5,420,592 A | 5/1995 | Johnson | |
| 5,432,699 A | 7/1995 | Hache et al. | |
| 6,205,851 B1 * | 3/2001 | Jogi | E21B 44/005 175/39 |
| 6,257,356 B1 * | 7/2001 | Wassell | E21B 7/06 166/66.5 |
| 6,267,185 B1 * | 7/2001 | Mougel | E21B 47/12 175/57 |
| 6,308,787 B1 * | 10/2001 | Alft | E21B 7/06 175/48 |
| 6,453,239 B1 | 9/2002 | Shirasaka | |
| 6,493,631 B1 | 12/2002 | Burns | |
| 6,633,816 B2 | 10/2003 | Shirasaka et al. | |
| 6,668,465 B2 | 12/2003 | Noureldin et al. | |
| 6,823,602 B2 | 11/2004 | Noureldin et al. | |
| 8,442,769 B2 | 5/2013 | Phillips et al. | |
| 2005/0022404 A1 | 2/2005 | Ash et al. | |
| 2009/0120690 A1 | 5/2009 | Phillips | |
| 2010/0211318 A1 | 8/2010 | Brooks | |
| 2013/0311084 A1 | 11/2013 | Lundquist et al. | |
| 2013/0317741 A1 | 11/2013 | Brashear et al. | |
| 2014/0214387 A1 | 7/2014 | Tilke | |
| 2016/0201455 A1 | 7/2016 | Liu et al. | |

FOREIGN PATENT DOCUMENTS

| | | |
|---|---|---|
| WO | WO 2015-119766 | 8/2015 |
| WO | WO2015119766 A1 | 8/2015 |
| WO | WO2016108901 A1 | 7/2016 |

OTHER PUBLICATIONS

Introduction to Wellbore Positioning by Angus Jamieson/UHI Scotland, (2012), p. 70.
Introduction to Wellbore Positioning by Angus Jamieson/UHI Scotland, (2012), p. 188.
BP-Amoco, Directional Survey Handbook, (1999), section 5.1.
BP-Amoco, Directional Survey Handbook, (1999), section 5.4.
BP-Amoco, Directional Survey Handbook, (1999), section 5.6.
D. Obradovic et al., "Fusion of sensor data in Siemens car navigatin system", IEEE Tran.Vehicular Tech., vol. 56, pp. 43-50, (2007).
Jacques Georgy, et al., "Low cost three dimensional navigation solution for RISS/GPS integration using mixture particle filter", IEEE Tran. Vehicular Tech., vol. 59, pp. 599-615, (2010).
"Introduction to wellbore positioning", University of the Highlands & Islands (2012). Survey Calculation Methods, Sect.7, pp. 48-52.
Paul D. Groves, "Principles of GNSS, Inertial and Multisensor Integrated Navigation Systems," Artech House (2001). Ch.5, Inertial navigation system.
Notification of Transmittal of International Search Report and the Written Opinion of the International Searching Authority for PCT/US2016/054256; dated Jan. 11, 2017.
International Search Report of the International Searching Authority for PCT/US2016/054256; dated Jan. 11, 2017.
Written Opinion of the International Searching Authority for PCT/US2016/054256; dated Jan. 11, 2017.
Notification Concerning Transmittal of International Preliminary Report on Patentability for PCT/US2016/054256; dated Nov. 2, 2017.
International Preliminary Report on Patentability for PCT/US2016/054256; dated Nov. 2, 2017.
Professor Angus Jamieson, et al., "Introduction to wellbore positioning," University of the Highlands and Islands, 2012, Version: V05.08.16, pp. 1-197.
International Search Report and Written Opinion for Application No. PCT/US2016/068148, dated Apr. 12, 2017 (18 pages).
Chulliat, Arnaud et al., "The US/UK World Magnetic Model for 2015-2020: Technical Report", National Geophysical Data Center, NOAA, 2015, 112 pages.
Frosio, I Uri et al., "Autocalibration of MEMS Accelerometers", IEEE Transactions on Instrumentation and Measurement, Jun. 2009, pp. 2034-2041, vol. 58, No. 6.
Prikhodko, Igor P., "What is MEMS Gyrocompassing? Comparative Analysis of Maytagging and Carouseling", Journal of Microelectromechanical Systems, Dec. 2013, pp. 1257-1266, vol. 22, No. 6.
"U.S./U.K. World Magnetic Model— Epoch 2015.0 Geomagnetic Longitude and Latitude", Dec. 2014, NOAA/NGDC & CIRES, 1 page.
U.S. Appl. No. 15/253,704, filed Aug. 31, 2016.
U.S. Appl. No. 15/253,694, filed Aug. 31, 2016.
International Preliminary Report on Patentability dated May 1, 2018 for PCT Application No. PCT/US2016/068148 (7 pages).
Notification of Transmittal of International Search Report and the Written Opinion of the International Searching Authority for PCT/US2017/063336; dated Mar. 5, 2018.
International Search Report of the International Searching Authority for PCT/US2017/063336; dated Mar. 5, 2018.
Written Opinion of the International Searching Authority for PCT/US2017/063336; dated Mar. 5, 2018.
International Preliminary Report on Patentability for PCT/US2017/063336; dated Jan. 11, 2019.

* cited by examiner

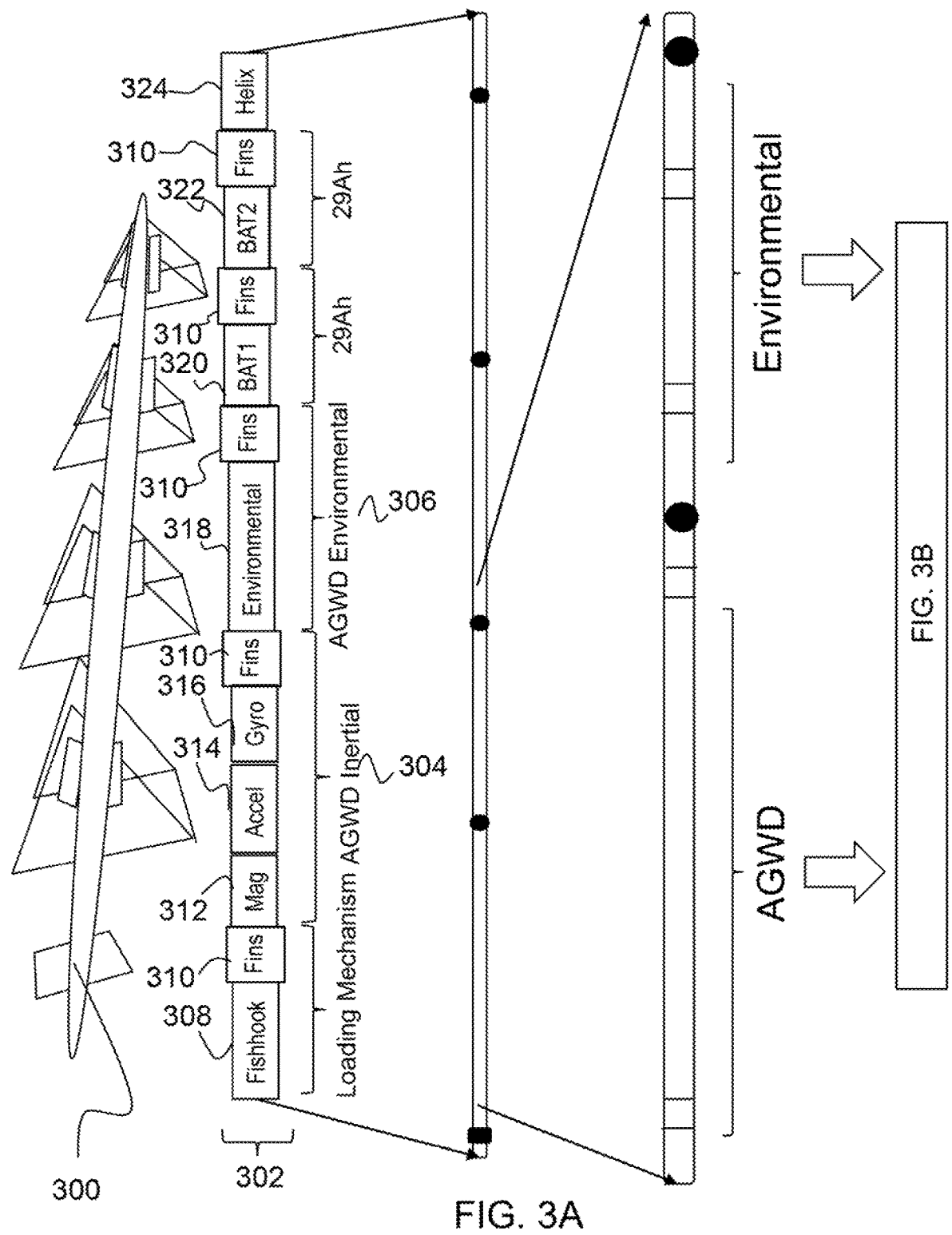

OPPORTUNISTIC SENSOR FUSION ALGORITHM FOR AUTONOMOUS GUIDANCE WHILE DRILLING

CROSS-REFERENCE TO RELATED APPLICATIONS

This is a Continuation-in-Part patent application of U.S. application Ser. No. 15/387,435, filed in the United States on Dec. 21, 2016, entitled, "Gyromagnetic Geopositioning System," which is a Non-Provisional patent application of U.S. Provisional Application No. 62/321,042, filed in the United States on Apr. 11, 2016, entitled, "Stabilization of Coriolis Vibratory Gyroscopes by Frequency Locking to Ultra Stable Clocks," the entirety of which are hereby incorporated by reference.

This is a Continuation-in-Part patent application of U.S. application Ser. No. 15/279,390, now U.S. Pat. No. 10,246,988, filed in the United States on Sep. 28, 2016, entitled, "Real-Time Trajectory Estimation with Multi-Station Analysis," which is a Non-Provisional patent application of U.S. Provisional Application No. 62/233,936, filed in the United States on Sep. 28, 2015, entitled, "Real Time Trajectory Estimation with Multi-Station Analysis," the entirety of which are hereby incorporated by reference.

This is ALSO a Non-Provisional patent application of U.S. Provisional Application No. 62/427,561, filed in the United States on Nov. 29, 2016, entitled, "Incremental Trajectory Estimation Based on Real Time Inertial Sensing," the entirety of which is hereby incorporated by reference.

This is ALSO a Non-Provisional patent application of U.S. Provisional Application No. 62/451,019, filed in the United States on Jan. 26, 2017, entitled, "Opportunistic Sensor Fusion Algorithm for Autonomous Guidance While Drilling," the entirety of which is hereby incorporated by reference.

BACKGROUND OF INVENTION

(1) Field of Invention

The present invention relates to a system for estimating a trajectory of a borehole and, more particularly, to a system for estimating a trajectory of a borehole by combining various sensor data streams.

(2) Description of Related Art

Recently, drilling of complicated well trajectories for boreholes has increased. A borehole is a narrow shaft bored in the ground, vertically and/or horizontally, which is constructed for a variety of purposes. There is typically a vertical section from surface, then a curve transition section from vertical to horizontal, and then a horizontal section in the oil and gas reserve. A borehole may be drilled for extraction of water, other liquids (e.g., petroleum) or gases (e.g., natural gas), or as part of a geotechnical investigation, environmental site assessment, mineral exploration, or temperature measurement.

In U.S. Pat. No. 4,454,756 (hereinafter referred to as the '756 patent) by Sharp, Sharp described an inertial borehole survey system that required the use of a wireline to provide measured depth (MD) (probe position) information and rate of penetration (ROP) (probe velocity). Signals are sent to the surface for processing to compute and record probe position. Basic Kalman Filtering of survey data and continuous data is done at the surface only after the tool is run. Additionally, the system is intended only for conventional vertical wells, and lacks a high performance magnetometer.

Further, U.S. Pat. No. 4,542,647 (hereinafter referred to as the '647 patent) by Molnar describes a borehole inertial guidance system that also requires the use of a wireline to provide measured depth (MD) (probe position) information and rate of penetration (ROP) (probe velocity). The system uses only two gyro axes and synthesizes the third axis from either an accelerometer or Earth rate depending on probe velocity. Additionally, the '647 patent describes Basic Kalman Filtering of gyrocompass and INS solutions.

Thus, a continuing need exists for a standalone autonomous system with advanced real-time Kalman Filter-based algorithms to generate optimal position/trajectory and minimal positional uncertainty in an autonomous manner.

SUMMARY OF INVENTION

The present invention relates to a system for estimating a trajectory of a borehole and, more particularly, to a system for estimating a trajectory of a borehole by combining various sensor streams. The system comprises an inertial sensor system, and one or more processors and a non-transitory computer-readable medium having executable instructions encoded thereon such that when executed, the one or more processors perform multiple operations. The system processes signals of sensor streams obtained from the environmental sensor system and the inertial sensor system, resulting in a set of processed signals. Using the set of processed signals, the system determines whether a drill is in a survey mode state or a continuous mode state. A measured depth of the borehole is determined using the set of processed signals. A set of survey mode positioning algorithms are applied to the set of processed signals when the drill is stationary. A set of continuous mode navigation algorithms are applied to the set of processed signals when the drill is non-stationary. Using at least one Kalman filter, results of the set of survey mode positioning algorithms and the set of continuous mode navigation algorithms are combined. An estimate of a borehole trajectory and corresponding ellipse of uncertainty (EOU) is generated using the combined results.

In another aspect, the system comprises an environmental sensor system, and wherein the system processes signals of sensor streams obtained from the environmental sensor system.

In another aspect, the set of survey mode positioning algorithms are combined for estimating a first borehole trajectory and EOU using a survey mode Kalman filter. The set of continuous mode navigation algorithms are combined for estimating a second borehole trajectory and EOU using a continuous mode Kalman filter. The first borehole trajectory and EOU and the second borehole trajectory and EOU are combined into a final borehole trajectory and EOU.

In another aspect, the inertial sensor system comprises at least three axes of microelectromechanical systems (MEMS) gyroscopes, at least three axes of MEMS accelerometers, and at least three axes of magnetometers.

In another aspect, the environmental sensor system comprises at least three axes of microelectromechanical systems (MEMS) gyroscopes, at least three axes of MEMS accelerometers, a drilling fluid pressure transducer, and a drilling fluid temperature sensor.

In another aspect, the set of survey mode positioning algorithms comprises a gyromagnetic geopositioning algorithm, a magnetic compass surveying algorithm, and a gyrocompass surveying algorithm.

In another aspect, the set of continuous mode navigation algorithms comprises a magnetometer-based incremental trajectory estimation algorithm, a gyroscope-based incremental trajectory estimation algorithm, and an open-loop inertial navigation system algorithm.

In another aspect, wherein the estimated borehole trajectory and corresponding EOU are used to locate one of an oil reserve and a gas reserve.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where:

FIG. 3A is an illustration of the opportunistic sensor fusion algorithm (OSFA) for the autonomous guidance while drilling (AGWD) system, including a physical apparatus, according to some embodiments of the present disclosure;

DETAILED DESCRIPTION

Figure 1:
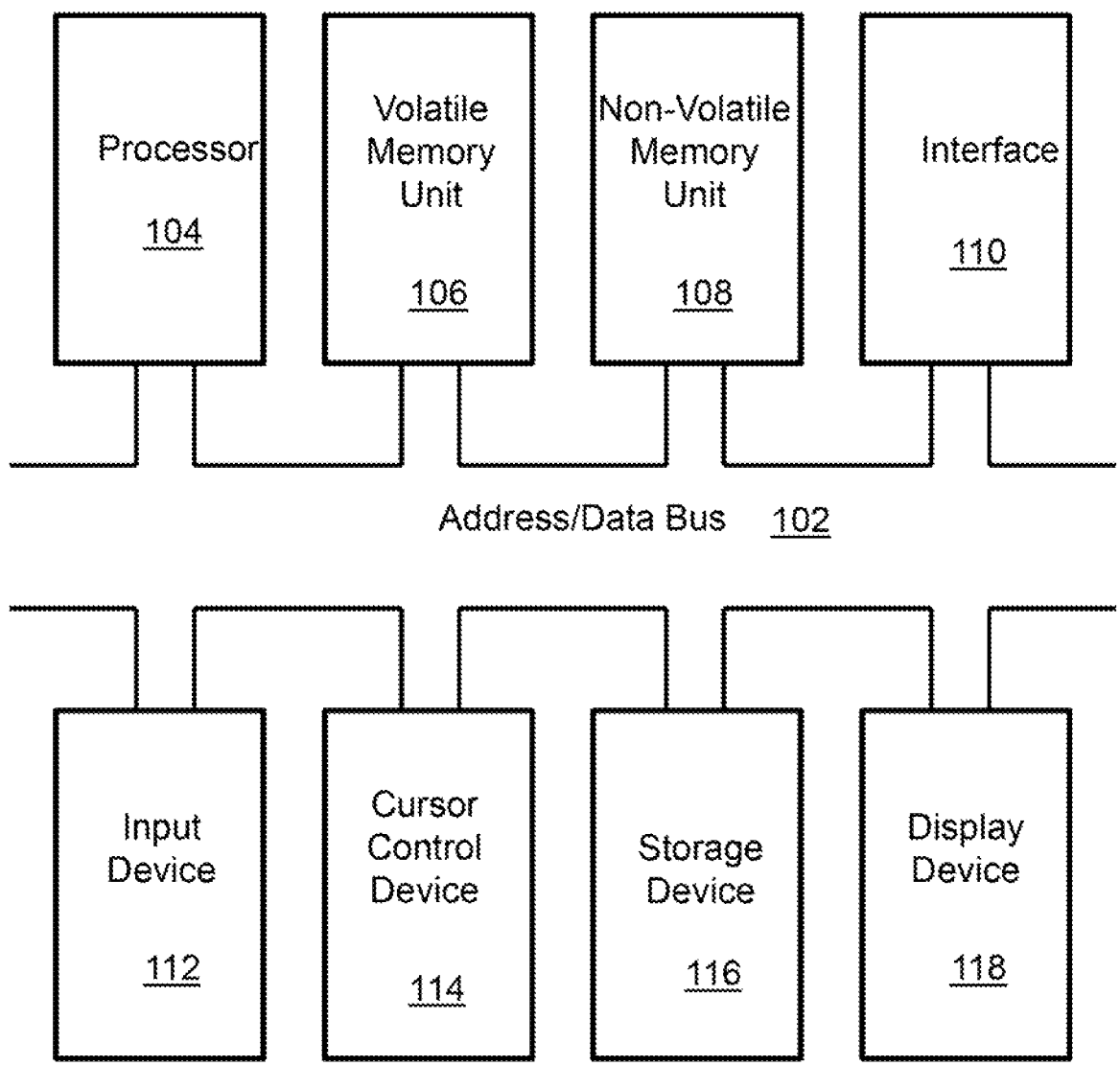
FIG. 1 is a block diagram depicting the components of a system for estimating a trajectory of a borehole according to some embodiments of the present disclosure.

The present invention relates to a system for estimating a trajectory of a borehole and, more particularly, to a system for estimating a trajectory of a borehole by combining various sensor streams. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

(1) Principal Aspects

Various embodiments of the invention include three "principal" aspects. The first is a system for estimating a trajectory of a borehole. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/ data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
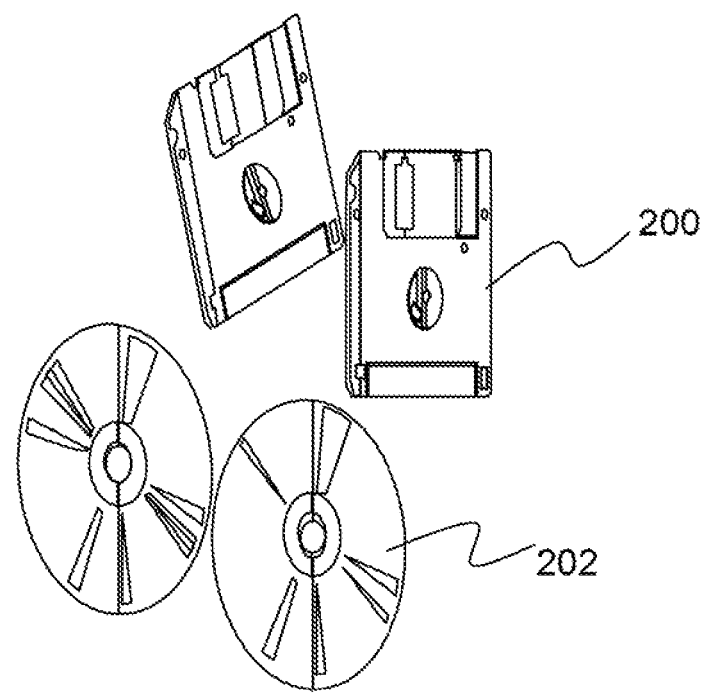
FIG. 2 is an illustration of a computer program product according to some embodiments of the present disclosure.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(2) Specific Details of Various Embodiments

Described herein is a system and apparatus, referred to as the Autonomous Guidance While Drilling (AGWD) system, which optimally estimates the trajectory of a borehole with minimum error in real-time. The system may then provide real-time autonomous navigation and guidance of the Bottom Hole Assembly (BHA), which may include a steerable drill bit in one configuration or send the BHA position to the surface where it can be used to steer the well by commanding the rig actions in another configuration to enable true autonomous drilling.

The system according to embodiments of the present disclosure comprises autonomously combined survey mode and continuous mode real-time inertial navigation and positioning. The rig state is determined to be either in survey mode or continuous mode based on motion of the drill/rig, and appropriate triggers (to trigger an operation) and enables are sent to the rest of the system. An enable is typically some kind of logic signal that turns on or off some sub-component of either software or hardware. For software, it could be a bit (a 1 or a 0) in memory that controls whether a certain sequence of code is executed or not. For hardware, an enable can be a voltage signal on a signal line that controls whether a chip is on or off. For example, a microprocessor can enable or disable a peripheral chip like a memory or sensor interface. In an embodiment of the invention, three survey mode positioning algorithms and three continuous mode navigation algorithms are fused together for downhole drilling.

Additionally, the system utilizes signal processing and fusion of various sensor streams using custom Kalman Filter(s). The master Kalman Filter may be composed of several sub Kalman Filters cascaded together. Alternatively, the master Kalman Filter can be a single Kalman Filter with a larger number of internal states (e.g., ≥30 states). The mathematical internals of the Kalman Filter(s) of the invention are unique due to the combination of the three survey mode and three continuous mode positioning and navigation algorithms. Each of the above aspects will be described in further detail below.

There are multiple unique aspects of the AGWD system. For instance, the AGWD system combines various sensor streams in a meaningful and optimal way. Given the complexity of the system, there is not one obvious solution to combining the sensor streams. The internal mathematical construction of the Kalman Filter (or system of Kalman Filters) used to combine all six positioning and navigation algorithms according to embodiments of the present disclosure is necessarily unique due to the specifics of each positioning and navigation algorithm.

The AGWD system described herein incorporates an automatic downhole calibration procedure (as described in U.S. Provisional Application No. 62/477,327, which is hereby incorporated by reference as though fully set forth herein) to cross-calibrate the microelectromechanical systems (MEMS) gyroscopes as needed, which greatly improves the performance of the system. The AGWD system is able to determine its distance traveled using various methods. Most notably, a unique mud pressure time of flight method is proposed and developed as described in U.S. Provisional Application No. 62/477,344, which is hereby incorporated by reference as though fully set forth herein. Using distance traveled information greatly reduces growth of position uncertainty, enabling use of an Incremental Trajectory Estimation (ITE) algorithm (described in U.S. Provisional Application No. 62/427,561 (hereinafter referred to as the '561 application), which is hereby incorporated by reference as though fully set forth herein) in place of or in addition to a traditional Inertial Navigation System (INS). ITE is a unique method (see the '561 application) and, therefore, the fusion of ITE with survey mode position measurements and other algorithms is not obvious from a Kalman Filter perspective.

The system described herein allows real-time localization of the course or trajectory of an oil wellbore as it is being drilled with greater position accuracy than previously achievable using conventional Measurement-While-Drilling (MWD) technology. As will be described in detail below, an opportunistic sensor fusion algorithm (OSFA) for the AGWD system achieves this goal through a superior combination of inertial sensors (most notably, the addition of a three-axis cluster of robust, high performance MEMS gyroscopes) and advanced system algorithms to optimally combine the multiple sensor streams into a navigation solution with minimal residual position uncertainty. Compared with conventional MWD technology, which leaves a residual positional uncertainty of approximately +/−65 feet (2 sigma) at the end of a 20,000 foot unconventional horizontal well, AGWD is expected to deliver greater than 3× improvement, reaching below +/−23 feet (2 sigma) residual positional uncertainty.

Figure 3B:
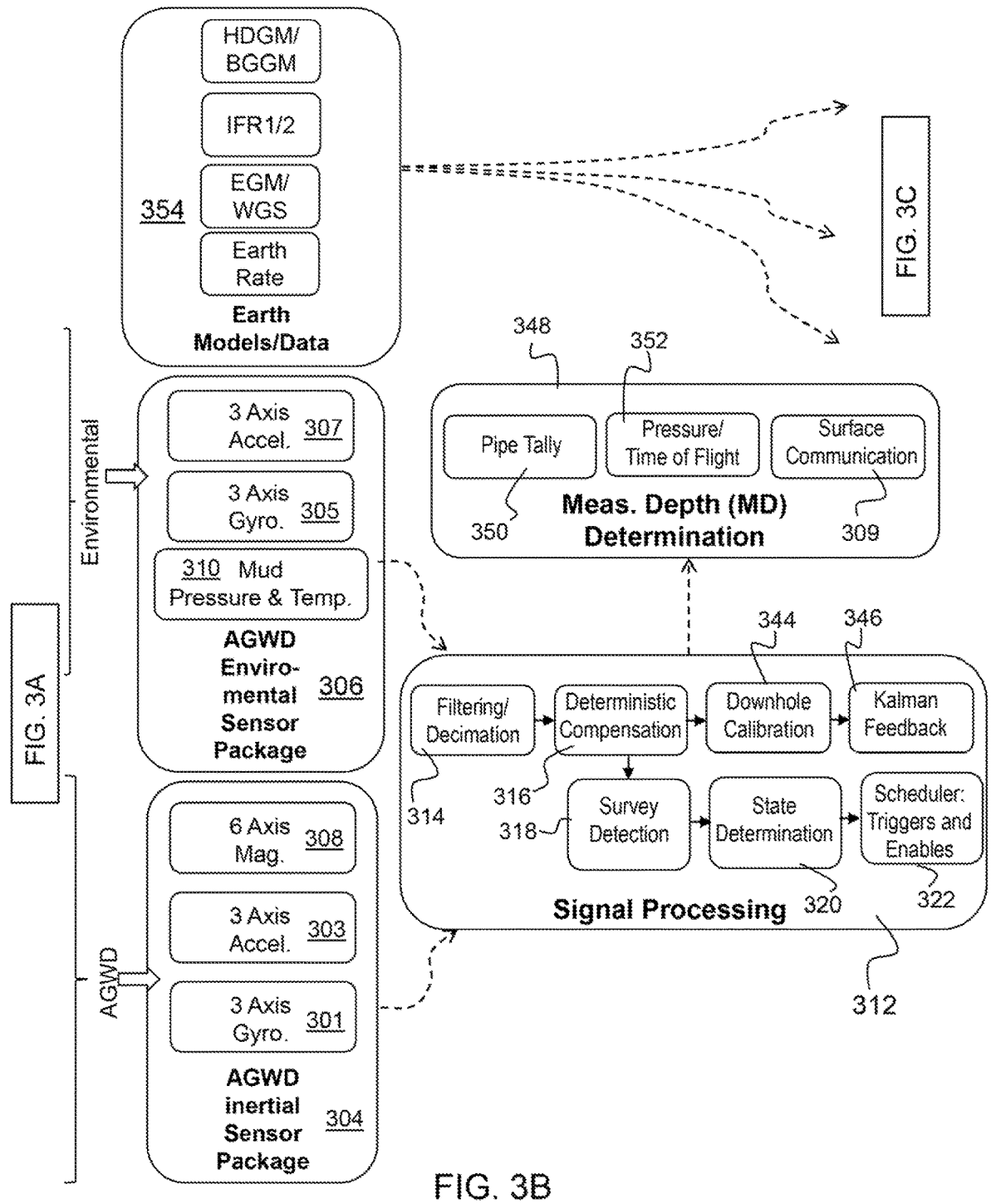
FIG. 3B is an illustration of the OSFA for the AGWD system, including an environmental sensor package, an inertial sensor package, signal processing, and measured depth determination, according to some embodiments of the present disclosure.

FIGS. 3A-3D illustrate a high level overview of the disclosed invention. The system comprises a physical apparatus and a system algorithm which runs on embedded computing hardware in the physical apparatus. An illustration of a prototypical physical apparatus, a AGWD apparatus 300, is shown in FIG. 3A. In one embodiment, the AGWD apparatus 300 is in the form of a standalone downhole probe or sonde which is encased in a Copper-Beryllium pressure vessel to withstand the extreme pressures (up to 20,000 pounds per square inch (PSI)) in the drilling environment. A diagram 302 of the AGWD sonde configuration shows its various internal modules. The key modules used in the Opportunistic Gyrocompassing Algorithm described in this disclosure are the AGWD Inertial Sensor Package (element 304) and the AGWD Environmental Sensor Package (element 306). Their locations in the prototype are indicated.

A fishhook/loading mechanism (element 308) is a specially shaped end piece of the copper-beryllium (Cu—Be) sonde which enables recovery back to the surface without removing the drill pipe. It is also used to lift the sonde into the drill pipe. Hence, in the drilling rig, the fishhook/loading mechanism (element 308) is actually the top of the AGWD apparatus 300 (closest to the sky) when it is in its vertical orientation. This is a standard piece of equipment in the oil and gas industry. Centralizer fins (element 310) hold the Cu—Be sonde in the center of the drill pipe. They are typically made of a hard rubber or elastomer material. This is a standard piece of equipment standard in the oil and gas industry.

The AGWD Inertial Sensor Package (element 304) comprises the following high performance inertial sensors: three axis magnetometers (Mag; element 312), three axis accelerometers (Accel; element 314), and three gyroscopes (Gyro; element 316).

The AGWD Environmental Sensor Package (element 306) comprises an environmental sensor (element 318) including a low performance, high range accelerometer and gyroscope cluster (3 axis each), as well as drilling fluid (drilling mud) pressure and temperature sensors.

BAT1 (element 320) and BAT2 (element 322) are the batteries that power the system. Although not limited thereto, they are, for example, lithium ion batteries rated for high temperature. Their capacity is 29 ampere-hours each (Ah), and they provide 29 V output. The helix (element 324) is a piece that attaches the Cu—Be sonde to the drillstring. This is a standard piece in the industry. This is the bottom of the AGWD apparatus 300.

As shown in FIG. 3B (which continues from FIG. 3A), the two key sensor packages acquire and stream data from their sensors. The AGWD Inertial Sensor Package (element 304) acquires data from its high precision sensors at approximately 100 Hertz (Hz), while the AGWD Environmental Sensor Package (element 306) acquires data from high range, lower precision sensors at 1000 Hz. Thus, the key distinguishing features between the Environmental Sensor Package (element 306) and the Inertial Sensor Package (element 304) are the rate of data acquisition and the accuracy and precision levels of the accelerometers and gyroscopes contained within each. Furthermore, the Inertial Sensor Package (element 304) has at least a three-axis high performance magnetometer (element 308) while the Environmental Sensor Package (element 306) loses the magnetometer but picks up a pressure and temperature transducer (element 310) which is in contact with the circulating drilling fluid (i.e., the "mud").

As shown in FIG. 3B, the sensor data streams are fed to a signal preprocessing block 312 which first synchronizes, aligns, filters, and decimates 314 (i.e., downsampling with appropriate filtering) the data to approximately one second time periods. A deterministic compensation 316 is applied using the scale factor, misalignment, and bias coefficients obtained from laboratory calibration testing over temperature. This process converts the raw voltage signals obtained from the analog-to-digital converters connected to the sensors into engineering units corresponding to the sensor type. Accelerometers measure acceleration in units of meters/seconds squared ($m/s^2$) or standard "g"s. Gyroscopes measure rotation rates in units of degrees per second or degrees per hour. Magnetometers measure magnetic fields in units of Teslas. Pressure is measured in Pascals or Pounds per Square Inch (PSI). Temperature is measured in degrees Celsius or degrees Fahrenheit.

Figure 3C:
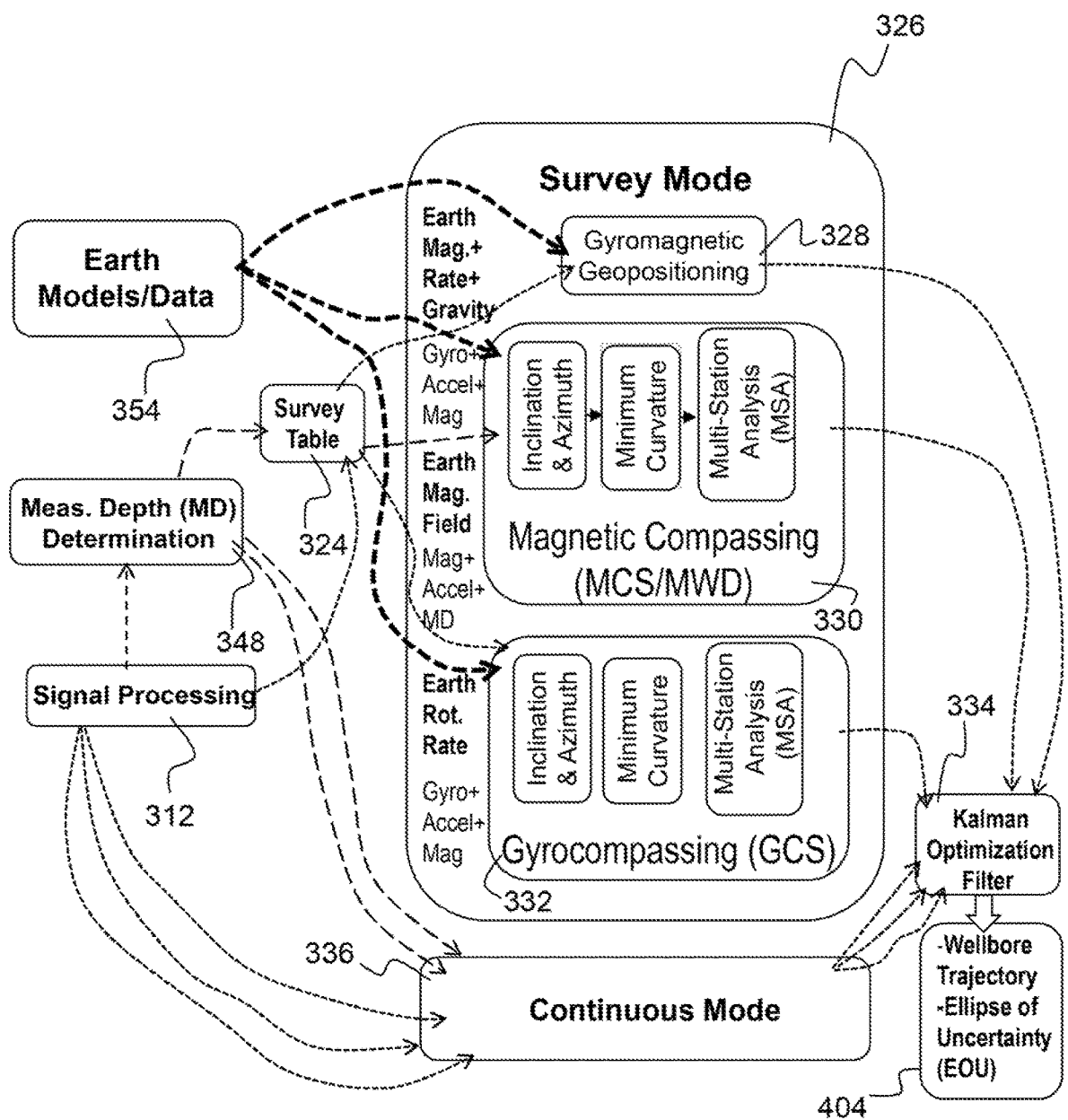
FIG. 3C is an illustration of the OSFA for the AGWD system, including a detailed depiction of the survey mode, according to some embodiments of the present disclosure.

After applying deterministic compensation 316 to all of the sensor streams, the signal preprocessing block 312 then calculates sensor statistics (e.g., standard deviations, means, Allan deviations) using the one second time windows. A buffer is running during this time which collects a longer duration (>1 second) window of sensor data. When variance of the data contained in the buffer is less than a certain threshold (the particular combination and thresholds can be set depending on the desired sensor types to be used), the buffer is deemed to contain a survey (survey detection 318). Referring to FIGS. 3B and 3C, the mean value and standard deviation of the survey is recorded in a separate survey table 324 for each sensor type. The state of the system is determined to be in survey mode 326 at this point (state determination 320). Therefore, the scheduler 322 (triggers and enables) will trigger the survey mode algorithms which operate on the survey table 324 data.

As depicted in FIG. 3C, there are three possible survey mode positioning algorithms: (1) gyromagnetic geopositioning 328 (described in U.S. Provisional Application No. 62/233,936 (hereinafter referred to as the '936 application) which is hereby incorporated by reference as though fully set forth herein), (2) magnetic compass surveying with minimum curvature (the industry standard algorithm) (MCS/MWD 330), and (3) gyrocompass surveying (GCS) 332. MCS/MWD is described in Introduction to Wellbore Positioning by Angus Jamieson/UHI Scotland, pages 39-41 and 188 and BP-Amoco Directional Survey Handbook, section 5.2, which are incorporated herein by reference. GCS is described in Introduction to Wellbore Positioning by Angus Jamieson/UHI Scotland, page 70 and BP-Amoco Directional Survey Handbook, sections 5.4 and 5.6, which are incorporated herein by reference. Additionally, if needed, the Kalman optimization filter 334 is put into its measurement configuration.

When the system is not in survey mode, the scheduler (FIG. 3B, element 322) places the system in continuous mode 336. In continuous mode 336, the sensor data streams are fed continuously into the various navigation algorithms at their native sampling rates (e.g., 100 Hz), rather than being placed in a survey table 324. A real-time navigation solution is obtained in continuous mode 336, compared with survey mode 326 which only is triggered when the drilling operation is stationary.

There are three possible continuous mode navigation algorithms: (1) Magnetic-based Incremental Trajectory Estimation (Mag-ITE) 338, (2) Gyro-based Incremental Trajectory Estimation (Gyro-ITE) 340, and (3) an Inertial Navigation System (INS) 342. The ITE methods were disclosed in the '561 application. In continuous mode 336, the Kalman optimization filter 334 operates in a streaming manner, fusing the last known position from survey mode 326 with the continuous mode navigation algorithm estimates (from elements 338, 340, and 342) to provide a better estimate of the overall system position in real-time.

Figure 4A:
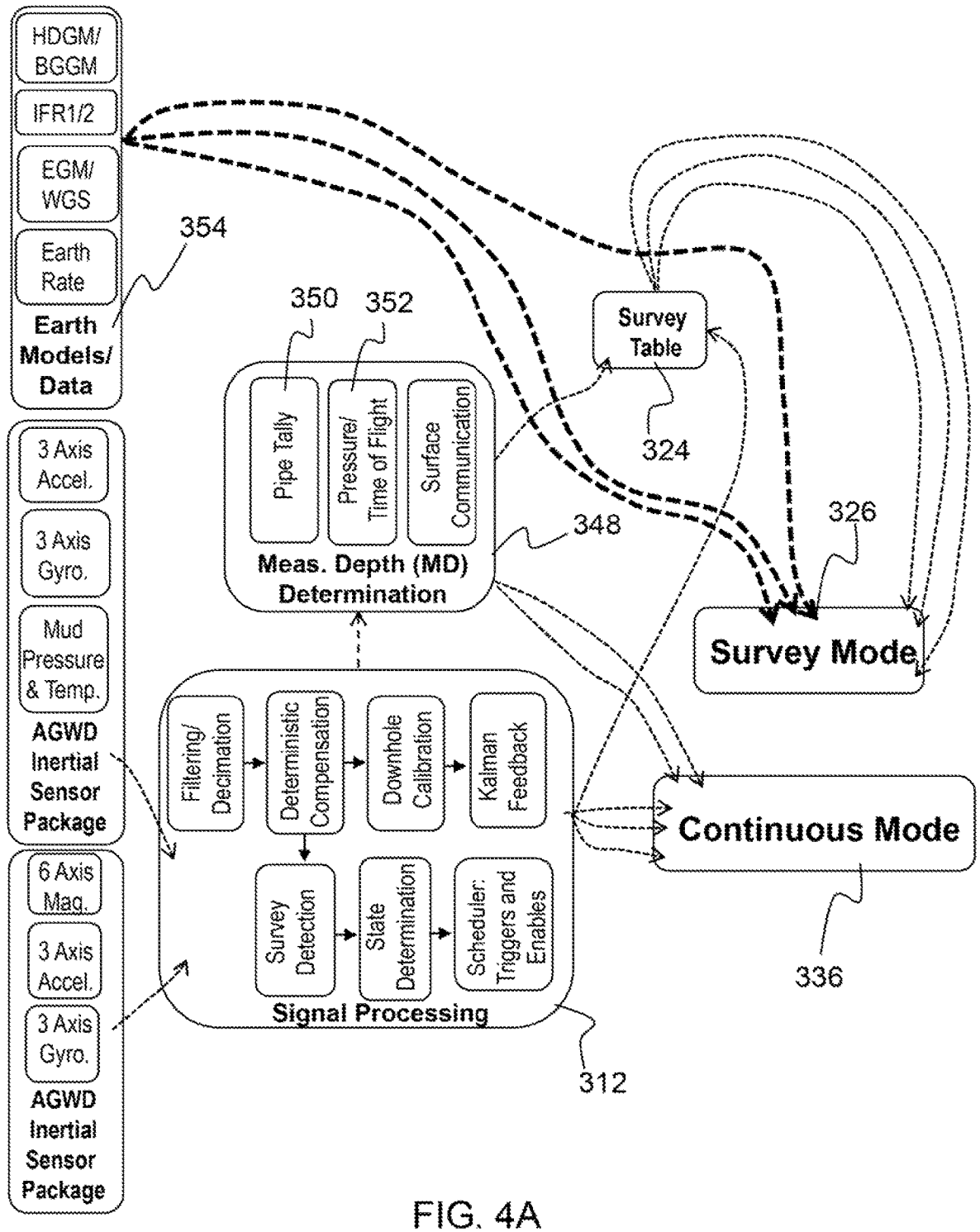
FIG. 4A is an illustration of an alternative embodiment of the OSFA for the AGWD system, including an environmental sensor package, an inertial sensor package, signal processing, measured depth determination, survey mode, and continuous mode, according to some embodiments of the present disclosure.
Figure 4B:
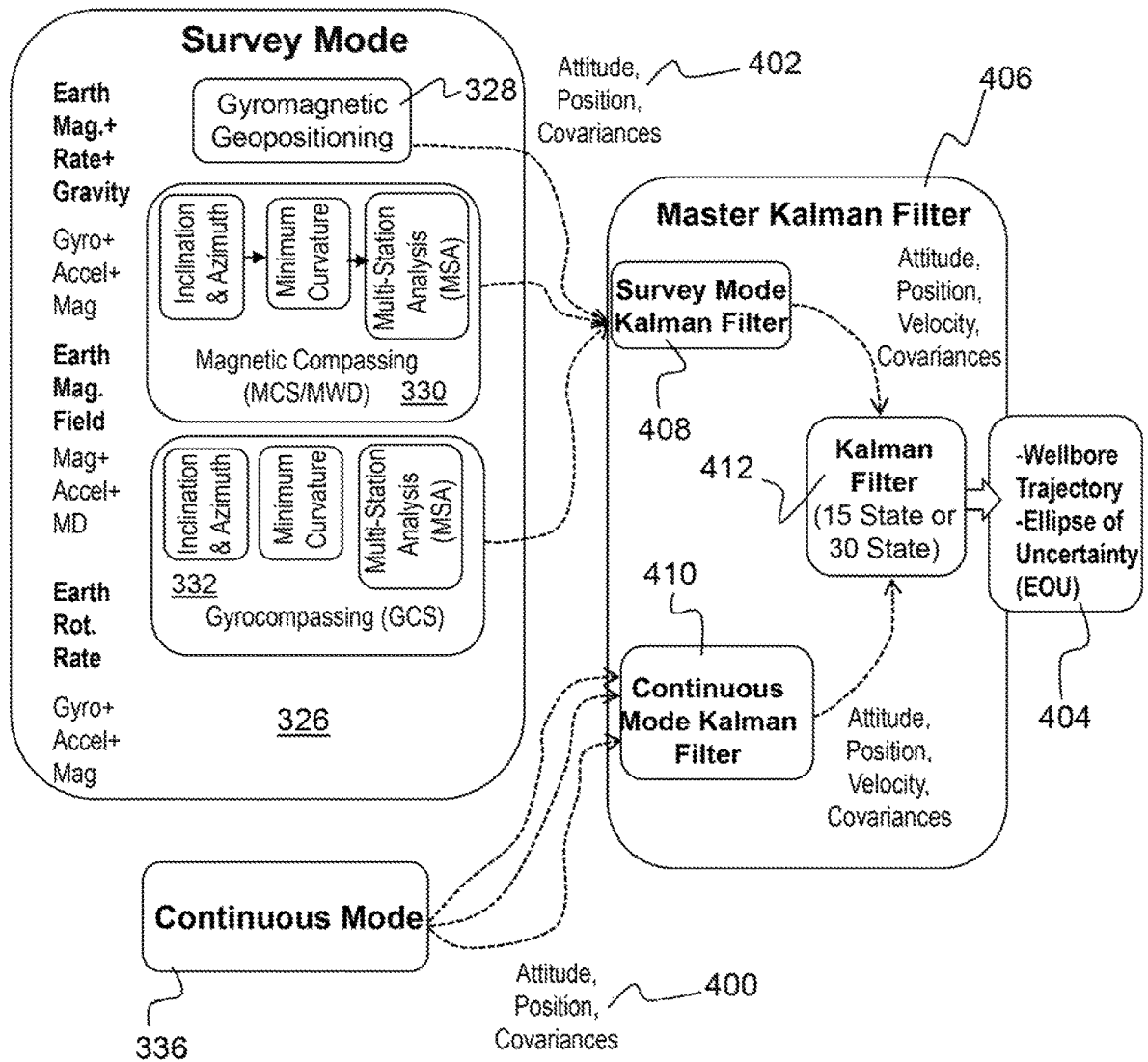
FIG. 4B is an illustration of a master Kalman filter formed from cascaded sub Kalman filters according to some embodiments of the present disclosure.

As depicted in FIG. 4B, the attitudes, positions, velocities, and their respective co-variances obtained from each navigation algorithm in continuous mode 400 or survey mode 402 are fed into the Kalman optimization filter 334 which performs an optimized fusion depending on which mode it is operating in and how uncertain each particular navigation is based on the sensor inputs and derived system state. The Kalman optimization filter 334 can have various architectures depending on the order in which the navigation algorithms are to be fused. These possibilities are shown in FIG. 4B. The final output of the Kalman optimization filter 334 is an optimized wellbore trajectory or path and its companion residual Ellipse of Uncertainty (EOU) 404, which typically demarks the 2-sigma 95% confidence bounds of the wellbore position (and path) in all three spatial dimensions.

As illustrated in FIGS. 3A-3D, in the signal preprocessing 312 block, prior to sending the sensor signal streams to the continuous mode 336 navigation algorithms or to the survey mode survey table 324, a second level of sensor compensation is applied. This is referred to as downhole calibration 344 and is disclosed in U.S. Provisional Application No. 62/477,327. After applying the downhole calibration 344, the residual gyro and accelerometer bias estimates obtained from the Kalman optimization filter can be subtracted off (Kalman feedback 346). Thus, the AGWD system has the unique feature of three levels of calibration ranging from coarse to ultra-fine: deterministic calibration/compensation (element 316) based on laboratory testing in various environments covering the expected downhole environmental ranges, downhole calibration (element 344) based on the data stored in the survey table (element 324), and a real-time continuous mode 336 calibration provided by the Kalman optimization filter 334.

A key parameter which enables very accurate estimation of wellbore trajectory through the additional algorithms is measured depth (MD). This is essentially the amount of drill pipe that has been connected in a drill string, so it is very easy to measure at the surface from the drilling rig, as is often done in the prior art. However, to date, there is no way to determine MD in an autonomous downhole navigation tool. A key feature of the AGWD system algorithm is downhole measured depth determination 348.

There are five possible ways to determine MD downhole starting from the simplest. First, the MD can be transmitted to the downhole tool. However, it is rare to have the ability in the oil and gas industry for communication from rig surface to downhole. Wired drill-pipe exists and could potentially be used to implement this capability, but is very costly and no surface to downhole tool communication of MD takes place. It may be possible to send mud pressure pulses from uphole-to-downhole, but this runs the risk of interference with the existing downhole-to-uphole communication mud pulsers. Finally, very low frequency (VLF) antennas may be able to transmit through the Earth's crust to reach the downhole tool. Therefore, communication MD from surface to downhole is very challenging or too costly with present day technologies.

Second, to determine MD downhole, the number of pipe connections can be counted and tallied (i.e., pipe tally 350). Each pipe is known to be approximately 90 feet length (or can be standardized to an arbitrary length, as long as the length is consistent within a drilling run). Then, the MD will approximately be equal to the number of pipes inserted into the drillstring multiplied by the length of each pipe. This is useful mainly in survey mode 326, which can then be combined with the continuous mode 335 navigation solution.

Third, mud pressure (element 352) and temperature can be correlated with MD. There is evidence that these quantities do have correlation, but it may be difficult to get an accurate estimate of MD due to changes in hydrostatic pressure and temperature profiles when the wellbore is drilled laterally (i.e., MD is a very nonlinear function of mud pressure (element 352) and temperature). A fourth method to determine MD downhole is to estimate Rate of Penetration (ROP) from differential pressure. This would require sufficient data to accurately calibrate, but is feasible and unique. This option can be explored when sufficient data is available to estimate ROP. Fifth, the most accurate method determined is to measure the time of flight propagation (element 352) of the mud pulses from downhole-to-uphole and back by processing the downhole pressure transducer data. This technique is disclosed in U.S. Provisional Application No. 62/477,344. The third through the fifth methods for determining MD described above are unique to the invention described herein.

Finally, the various positioning/navigation algorithms in some cases require reference data of the Earth's gravitational field, magnetic field, and rotation rates. There is a separate block (Earth models/data 354) which handles making that data available to the algorithms as needed.

Figure 3D:
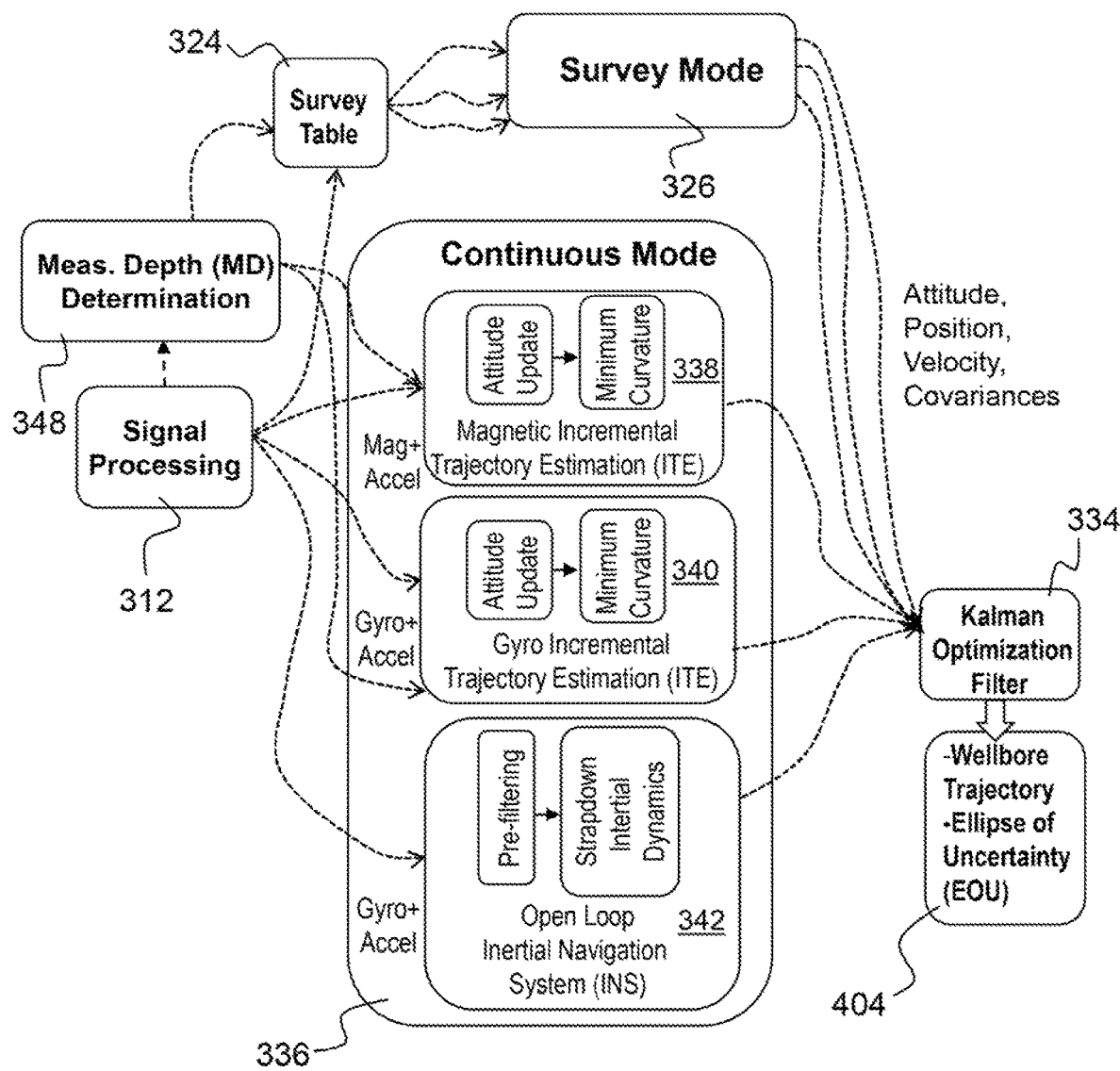
FIG. 3D is an illustration of the OSFA for the AGWD system, including a detailed depiction of the continuous mode, according to some embodiments of the present disclosure.

FIGS. 4A and 4B shows an alternate embodiment of the Kalman optimization filter 334 block shown in FIGS. 3C and 3D. Here, instead of a monolithic Kalman filter to fuse all six survey mode 326 and continuous mode 336 navigation and positioning algorithms, there is a master Kalman filter 406 which is formed by cascaded sub Kalman filters. The three survey mode positioning algorithms (elements 328, 330, and 332) feed the survey mode Kalman filter 408 and the three continuous mode navigation algorithms (elements 338, 340, and 342) feed the continuous mode Kalman filter 410. The output of these two Kalman filters 408 and 410 are then fed into a final combining Kalman filter 412, which is at least 15 states (3 positions, 3 velocities, 3 attitude angles, 3 accelerometer biases, and 3 gyroscope biases) and can be up to 30 states in some implementations (the previous 15 states plus scale factor and misalignment terms for the gyroscopes and accelerometers).

As described above and shown in FIG. 3B, the AGWD downhole system comprises an Inertial Sensor Package (element 304) comprising at least 3 axes of microelectromechanical systems (MEMS) gyroscopes (element 301), at least 3 axes of MEMS accelerometers (element 303), and at least 3 axes of fluxgate (or other) magnetometers (element 308). The inertial sensors are rated for high performance and capable of sensing small inertial signals with high precision and resolution. Each inertial sensor may have a built-in or companion high resolution temperature sensor for compensation use. The AGWD downhole system further comprises an environmental sensor package (element 306) comprises at least 3 axes of MEMS gyroscopes (element 305), at least 3 axes of MEMS accelerometers (element 307), a drilling fluid ("mud") pressure transducer (element 310), and a mud temperature sensor (element 310).

The AGWD downhole system further includes an appropriate number of analog-to-digital converters and companion microcontrollers to acquire the sensor signals and convert them to digital data streams which can be distributed for further processing (at a rate of at least 100 samples per second for each inertial sensor stream and a rate of at least 1000 samples per second for each environmental sensor stream). One (or more) embedded processor(s) (which could be implemented as a microcontroller, a digital signal processor, or a field-programmable gate array (FPGA)) perform the system algorithm depicted in FIGS. 3A-3D to compute the downhole wellbore trajectory and its attendant positional uncertainty (either as a covariance matrix or in industry standard terms as an Ellipse of Uncertainty (EOU)).

The opportunistic sensor fusion algorithm (OSFA) for the AGWD system comprises a signal preprocessing 312 block which performs: filtering and decimation of the sensor data streams (element 314); deterministic compensation using laboratory obtained calibration coefficients (including temperature and acceleration compensation) (element 316); survey detection (element 318) of sufficiently long quiet periods and calculated survey measurements and statistics (mean, standard deviation, Allan Deviation coefficients and time to minimum sensor uncertainty). The data is written to the survey table 324.

Drill state determination 320 is used to determine if the AGWD system is in survey mode 326 or continuous mode 336. The drill state determination 320 may use a combination of both the data from the AGWD Inertial Sensor Package (element 304) and the AGWD environmental sensor package (element 306). A scheduler routine (element 322) sends survey mode/continuous mode triggers and enables (which enable or disable a block depending on the signal level) as necessary to the rest of the system to control overall behavior. Additionally, the signal preprocessing 312 block performs a downhole calibration routine (element 344) as disclosed in U.S. Provisional Application No. 62/477,327. Feedback from the Kalman filter (element 346) is used to subtract the gyroscope and accelerometer biases as estimated by the Kalman filter.

Further, the OSFA for the AGWD system includes a measured depth (distance traveled or path length in non-drilling applications) determination block (element 348) which performs multiple operations. For instance, a basic pipe tally (element 350) is performed by counting the number of detected pipe connections and multiplying by the typical or average pipe length (e.g., through use of the survey detection block (element 318) when a sufficiently quiet period has been detected (sensor standard deviations below a certain threshold depending on the type of sensor) and/or through the use of the INS (Inertial Navigation System) to detect motion profiles. Determination of measured depth can also be performed by analyzing the time of flight between acoustic pulses generated by the downhole mud pulser (element 352) as measured by the environmental sensor package mud pressure transducer (element 310) and the received surface echo as disclosed in U.S. Provisional Application No. 62/477,344.

Moreover, measured depth can be determined by estimating the rate of penetration (ROP) by analyzing the differential pressure between the at rest bottom hole assembly (BHA) when the drill bit is backed off the bottom (not in contact with the rock surface (i.e., survey mode)) and the BHA in contact with the bottom rock face of the hole and actively drilling (this causes a restriction in the drilling mud flow, increasing the mud pressure as measured by the environmental sensor package mud pressure transducer (element 310) compared with the mud pressure when not actively drilling). The ROP is then integrated one time to obtain the MD estimate. In addition, measured depth can be estimated using a look-up table (LUT) derived from correlation between hydrostatic mud pressure and mud temperature and Measured Depth; the current Measured Depth is obtained by measuring the current mud pressure or temperature and interpolating in the LUT. Finally, measured depth can be determined as received from the surface using a uphole-to-downhole communication method (i.e., surface communication 309).

As shown in FIG. 3C, the OSFA for the AGWD system further comprises a survey table 324 which records the measurements made in survey mode 326, including: measured depth (element 348); the raw mean/average value, standard deviation, Allan Deviation (ADEV) coefficients (up to 5), and the time to minimum uncertainty as determined by the ADEV method for each sensor over the duration of the survey period as obtained after the deterministic compensation block (element 316); and a corrected mean/average value for each sensor after applying downhole calibration corrections (element 344) and Kalman filter feedback bias corrections (element 346).

As depicted in FIG. 3C, a set of survey mode positioning algorithms of the OFSA include gyromagnetic geopositioning 328 as disclosed in U.S. application Ser. No. 15/387,435 (hereinafter referred to as the '435 application), which is hereby incorporated by reference as though fully set forth herein. Magnetic compass surveying (MCS) calculates inclination from the 3-axis accelerometer cluster, azimuth from the 3-axis magnetometer, and then feeds these attitude angles along with measured depth to the minimum curvature algorithm to calculate an incremental trajectory leg. MCS is equivalent to industry standard MWD using only accelerometers and magnetometers and does not include high performance MEMS gyroscopes for navigation (element 330). An optional multi-station analysis can be performed if desired (described in the '936 application). Gyrocompass surveying (GCS) (element 332) calculates inclination from the 3-axis accelerometer cluster, azimuth from the 3-axis gyroscope cluster, and then feeds these attitude angles along with measured depth to the minimum curvature algorithm to calculate an incremental trajectory leg. GCS is an improvement made by the AGWD hardware by including a 3-axis cluster of MEMS gyroscopes in the tool. An optional multi-station analysis can be performed if desired (described in the '936 application).

A set of continuous mode navigation algorithms include a magnetometer-based incremental trajectory estimation (Mag-ITE) as disclosed in the '561 application and a gyroscope-based incremental trajectory estimation (Gyro-ITE) as disclosed in the '561 application (element 340). In addition, the set of continuous navigation algorithms include an open-loop inertial navigation system (INS) (element 342), which performs a quaternion attitude update from gyroscope measurements, uses this attitude to project the accelerometer measurements from the body reference frame to the navigation reference frame, and finally double integrates the accelerometer measurements in the navigation frame to derive position.

Referring to FIGS. 3C and 3D, a Kalman filter 334 uses a custom-derived Kalman filter algorithm (minimum of 15 states, up to 30 states if all sensor error terms are estimated) to optimally combine the position, velocity, attitudes, and corresponding covariance matrices from the six survey and continuous mode position and navigation algorithms (elements 328, 330, 332, 338, 340, and 342). The combination is used to generate a final estimate of the wellbore trajectory (its position) and corresponding Ellipse of Uncertainty (EOU) (element 404), which is derived from the output estimation covariance matrix of the Kalman filter, multiplied by 2 to obtain a 2-sigma 95% confidence EOU.

As depicted in FIG. 4B, an alternate embodiment of the Kalman filter block is a cascaded Kalman filter architecture instead of a monolithic Kalman filter algorithm which directly combines the six survey and continuous mode position and navigation algorithms into the optimal output wellbore trajectory and EOU. The cascaded Kalman filter architecture employed consists of a first survey mode Kalman filter (element 408) to optimally combine the three survey mode positioning algorithms (elements 328, 330, and 332) into a first wellbore trajectory and EOU. A second continuous mode Kalman filter (element 410) optimally combines the three continuous mode navigation algorithms (elements 338, 340, and 342) into an optimal wellbore and EOU. A third combining Kalman filter (element 412) combines the wellbore trajectories and EOUs from the survey mode Kalman filter (element 408) and the continuous mode Kalman filter (element 410) into a final optimal wellbore trajectory and EOU (element 404). The combining Kalman filter (element 412) can be a 15 state Kalman filter (or up to 30 state Kalman filter).

The invention described herein, suitably extended, is applicable to intelligence, surveillance, reconnaissance (ISR) products, such as underground navigation/surveillance, unmanned aerial vehicles, and underwater vehicles, as well as autonomous vehicles (e.g., terrestrial-based navigation). The AGWD system described herein forms the basis of being able to locate oil and gas reserves by providing the position of such reserves back to surface if they are detected by additional sensors added to the AGWD system. Further, variants of the disclosed OFSA for AGWD system are within the scope of the disclosed invention where the measured depth information obtained from the rig or other methods is replaced by an equivalent path length/distance traveled.

For example, a terrestrial vehicle could apply the same methods if its wheels had an accurate odometer, or some other method of getting the distance traveled or velocity information (radar or LIDAR or computer vision based). An underwater vehicle may use the speed through water and/or sonar signals to derive the distance traveled. In addition, an aerial vehicle may use the airspeed and/or radar/LIDAR/computer vision techniques to derive the distance traveled. For the underground or indoor navigation case, again, computer vision, radar, or LIDAR could be used to obtain the distance traveled information. In some of these cases, certain blocks of the OFSA would be disabled (e.g., it may not make sense to use survey mode algorithms for aerial vehicle applications, in which case continuous mode Incremental Trajectory Estimation could be fused with GPS as an alternate "survey").

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A system for estimating a trajectory of a borehole for drilling, the system comprising:
   an inertial sensor system; and
   one or more processors and a non-transitory computer-readable medium having executable instructions encoded thereon such that when executed, the one or more processors perform operations of:
      processing signals of sensor streams obtained from the inertial sensor system, resulting in a set of processed signals;
      using the set of processed signals, determining whether a drill is in a survey mode state or a continuous mode state;
      using the set of processed signals, determining a measured depth of the borehole;
      applying a set of survey mode positioning algorithms to the set of processed signals when the drill is stationary;
      applying a set of continuous mode navigation algorithms to the set of processed signals when the drill is non-stationary;
      using at least one Kalman filter, combining results of the set of survey mode positioning algorithms and the set of continuous mode navigation algorithms; and
      generating an estimate of a borehole trajectory and corresponding ellipse of uncertainty (IOU) using the combined results.

2. The system as set forth in claim 1, further comprising an environmental sensor system, wherein the one or more processors further perform an operation of processing signals of sensor streams obtained from the environmental sensor system.

3. The system as set forth in claim 1, wherein the one or more processors further perform operations of:
   combining the set of survey mode positioning algorithms for estimating a first borehole trajectory and EOU using a survey mode Kalman filter;
   combining the set of continuous mode navigation algorithms for estimating a second borehole trajectory and EOU using a continuous mode Kalman filter, and
   combining the first borehole trajectory and EOU and the second borehole trajectory and EOU into a final borehole trajectory and EOU.

4. The system as set forth in claim 1, wherein the inertial sensor system comprises at least three axes of microelectromechanical systems (MEMS) gyroscopes, at least three axes of MEMS accelerometers, and at least three axes of magnetometers.

5. The system as set forth in claim 2, wherein the environmental sensor system comprises at least three axes of microelectromechanical systems (MEMS) gyroscopes, at least three axes of MEMS accelerometers, a drilling fluid pressure transducer, and a drilling fluid temperature sensor.

6. The system as set forth in claim 1, wherein the set of survey mode positioning algorithms comprises a gyromagnetic geopositioning algorithm, a magnetic compass surveying algorithm, and a gyrocompass surveying algorithm.

7. The system as set forth in claim 1, wherein the set of continuous mode navigation algorithms comprises a magnetometer-based incremental trajectory estimation algorithm, a groscope-based incremental trajectory estimation algorithm, and an open-loop inertial navigation system algorithm.

8. A computer implemented method for estimating a trajectory of a borehole for drilling, comprising an act of causing one or more processors to execute instructions stored on a non-transitory memory such that upon execution, the one or more processors perform operations of:
   processing signals of sensor streams obtained from an inertial sensor system, resulting in a set of processed signals;
   using the set of processed signals, determining whether a drill is in a survey mode state or a continuous mode state;
   using the set of processed signals, determining a measured depth of the borehole;
   applying a set of survey mode positioning algorithms to the set of processed signals when the drill is stationary;
   applying a set of continuous mode navigation algorithms to the set of processed signals when the drill is non-stationary;
   using at least one Kalman filter, combining results of the set of survey mode positioning algorithms and the set of continuous mode navigation algorithms; and
   generating an estimate of a borehole trajectory and corresponding ellipse of uncertainty (IOU) using the combined results.

9. The method as set forth in claim 8, wherein the one or more processors further perform an operation of processing signals of sensor streams obtained from an environmental sensor system.

10. The method as set forth in claim 8, wherein the one or more processors further perform operations of:
    combining the set of survey mode positioning algorithms for estimating a first borehole trajectory and EOU using a survey mode Kalman filter;
    combining the set of continuous mode navigation algorithms for estimating a second borehole trajectory and EOU using a continuous mode Kalman filter; and
    combining the first borehole trajectory and EOU and the second borehole trajectory and EOU into a final borehole trajectory and EOU.

11. The method as set forth in claim 8, wherein the inertial sensor system comprises at least three axes of microelectromechanical systems (MEMS) gyroscopes, at least three axes of MEMS accelerometers, and at least three axes of magnetometers.

12. The method as set forth in claim 9, wherein the environmental sensor system comprises at least three axes of microelectromechanical systems (MEMS) gyroscopes, at least three axes of MEMS accelerometers, a drilling fluid pressure transducer, and a drilling fluid temperature sensor.

13. The method as set forth in claim 9, wherein the set of survey mode positioning algorithms comprises a gyromagnetic geopositioning algorithm, a magnetic compass surveying algorithm, and a gyrocompass surveying algorithm.

14. The method as set forth in claim 9, wherein the set of continuous mode navigation algorithms comprises a magnetometer-based incremental trajectory estimation algorithm, a gyroscope-based incremental trajectory estimation algorithm, and an open-loop inertial navigation system algorithm.

15. A computer program product for estimating a trajectory of a borehole for drilling, the computer program product comprising:
    computer-readable instructions stored on a non-transitory computer-readable medium that are executable by a computer having one or more processors for causing the processor to perform operations of:

processing signals of sensor streams obtained from an inertial sensor system, resulting in a set of processed signals;

using the set of processed signals, determining whether a drill is in a survey mode state or a continuous mode state;

using the set of processed signals, determining a measured depth of the borehole;

applying a set of survey mode positioning algorithms to the set of processed signals when the drill is stationary;

applying a set of continuous mode navigation algorithms to the set of processed signals when the drill is non-stationary;

using at least one Kalman filter, combining results of the set of survey mode positioning algorithms and the set of continuous mode navigation algorithms; and generating an estimate of a borehole trajectory and corresponding ellipse of uncertainty (EMI using the combined results.

16. The computer program product as set forth in claim 15, further comprising instructions for causing the one or more processors to further perform an operation of processing signals of sensor streams obtained from an environmental sensor system.

17. The computer program product as set forth in claim 15, further comprising instructions for causing the one or more processors to further perform operations of:

combining the set of survey mode positioning algorithms for estimating a first borehole trajectory and EOU using a survey mode Kalman filter;

combining the set of continuous mode navigation algorithms for estimating a second borehole trajectory and EOU using a continuous mode Kalman filter; and combining the first borehole trajectory and EOU and the second borehole trajectory and EOU into a final borehole trajectory and EOU.

18. The computer program product as set forth in claim 15, wherein the inertial sensor system comprises at least three axes of microelectromechanical systems (MEMS) gyroscopes, at least three axes of MEMS accelerometers, and at least three axes of magnetometers.

19. The computer program product as set forth in claim 16, wherein the environmental sensor system comprises at least three axes of microelectromechanical systems (MEMS) gyroscopes, at least three axes of MEMS accelerometers, a drilling fluid pressure transducer, and a drilling fluid temperature sensor.

20. The computer program product as set forth in claim 13, wherein the set of survey, mode positioning algorithms comprises a gyromagnetic geopositioning algorithm, a magnetic compass surveying algorithm, and a gyrocompass surveying algorithm.

21. The computer program product as set forth in claim 13, wherein the set of continuous mode navigation algorithms comprises a magnetometer-based incremental trajectory estimation algorithm, a gyroscope-based incremental trajectory estimation algorithm, and an open-loop inertial navigation system algorithm.

22. The system as set forth in claim 1, wherein the estimated borehole trajectory and corresponding EOU are used to locate one of an oil reserve and a gas reserve.

* * * * *